Feb. 13, 1962 T. M. MOORE ETAL 3,021,438

TRANSISTOR ENERGY STORAGE COUNTER

Filed Oct. 7, 1959

INVENTORS
THOMAS M. MOORE
EDWARD R. ARNOLD
BY
Paul A. Critchlow
ATTORNEYS

United States Patent Office 3,021,438
Patented Feb. 13, 1962

3,021,438

TRANSISTOR ENERGY STORAGE COUNTER

Thomas M. Moore, Glen Burnie, Md., and Edward R. Arnold, Brooklyn, N.Y., assignors, by mesne assignments, to the United States of America as represented by the Secretary of the Navy Filed Oct. 7, 1959, Ser. No. 845,045
7 Claims. (Cl. 307—88.5)

This invention relates to a transistor energy storage counter and more particularly to a transistor energy storage counter employing silicon diodes.

Vacuum tube energy storage counters are well known to the prior art. In general they involve a blocking oscillator with a feedback transformer from the plate circuit to the control grid circuit which is pulsed by input pulses to be counted or divided. The input pulse is coupled thru a diode to place a charge on a counting capacitor generally located in the grid circuit of the blocking oscillator. A second capacitor is usually interposed in series with the input so that the input pulse is divided according to the relative size of the two capacitors. The diode in between the two dividing capacitors serves to allow the counting capacitor to charge in one direction only, increasing its charge in increments between pulses. When the charge on the counting capacitor reaches the cut-off potential of the blocking oscillator, the blocking oscillator will pulse, discharge the counting capacitor by grid current flow, and leave the circuit in a condition for the next counting cycle. The disadvantages of this system are those which are inherent in vacuum tube circuitry, i.e., large power requirements, excessive heat dissipation, and relatively large bulk. In overcoming these disadvantages it becomes necessary to transistorize the vacuum tube energy storage counter. Many problems are encountered in the transition from vacuum tube counters to transistor counters. While the base electrode of a transistor can be considered the approximate equivalent of a vacuum tube control grid, there are many fundamental differences which must be considered. One of the main problems is the extremely low input impedance to the transistor circuit which prevents the proper retention of charge on the storage counter capacitor and creates difficulties in attempting to reset the counter circuits so as to maintain the proper initial charge following zero time. The large changes in base current which occur with changes in temperature add to the problems of operating an energy storage counter utilizing the storage capacitor in the base circuit, since stability of operation is a prime consideration.

It is thus an object of the present invention to provide a transistor energy storage counter which is not susceptible to wide variations due to temperature changes.

Another object is the provision of a transistor energy storage counter which has a high input impedance.

A further object of the invention is to provide a transistor energy storage counter with a positive reset circuit to maintain the proper initial count following zero time.

According to the invention, the transistor blocking oscillator utilizes a counting capacitor placed in the emitter circuit, which takes advantage of the relatively small changes in emitter current with temperature change. Feedback is obtained by transformer coupling energy from the collector to the emitter, rather than the base circuit, the base being grounded. One silicon diode is utilized for coupling the counting capacitor to the emitter, thereby isolating the low impedance of the emitter from the counting capacitor. Another silicon diode is employed to couple a reset trigger to the system. The reset trigger also triggers a dual gating circuit which applies a start potential at the emitter just after the reset trigger is applied and at the same time cuts off the reset trigger circuit from further operation during the counting time. The effects of temperature change are further nullified by the use of a final step-amplitude on the counting capacitor which is greater than the changes of firing potential of the transistor resulting from temperature changes. The starting potential across the counting capacitor is set by applying a variable voltage thru a fourth silicon diode in the same general manner utilized in most vacuum tube energy storage counters.

Other objects and many of the attendant advantages of this invention will be readily appreciated as the same becomes bettter understood by reference to the following detailed description when considered in connection with the accompanying drawings in which like reference numerals designate like parts throughout the figures thereof and wherein.

Figure 1:
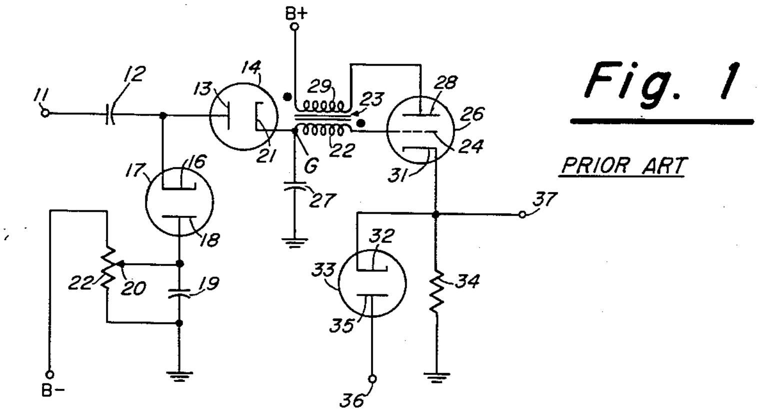
Fig. 1 PRIOR ART
FIG. 1 is a schematic diagram of a typical prior art vacuum tube energy storage counter.

Referring now to the drawings and in particular to FIG. 1, input terminal 11 is connected through capacitor 12 to plate 13 of diode 14. Plate 13 is also connected to cathode 16 of diode 17. Plate 18 of diode 17 is connected to capacitor 19 and sliding contact 20 on resistor 22. The top of resistor 22 is connected to B minus and the bottom to ground. The other side of capacitor 19 is also connected to ground. Cathode 21 of diode 14 is connected through winding 22 of transformer 23 to grid 24 of triode 26, and thru capacitor 27 to ground. Plate 28 of triode 26 is connected thru winding 29 of transformer 23 to B plus. Cathode 31 of triode 26 is connected to cathode 32 of diode 33 and thru resistor 34 to ground. Plate 35 of diode 33 is connected to terminal 36. Output terminal 37 is connected to cathode 31 of triode 26.

Figure 2:
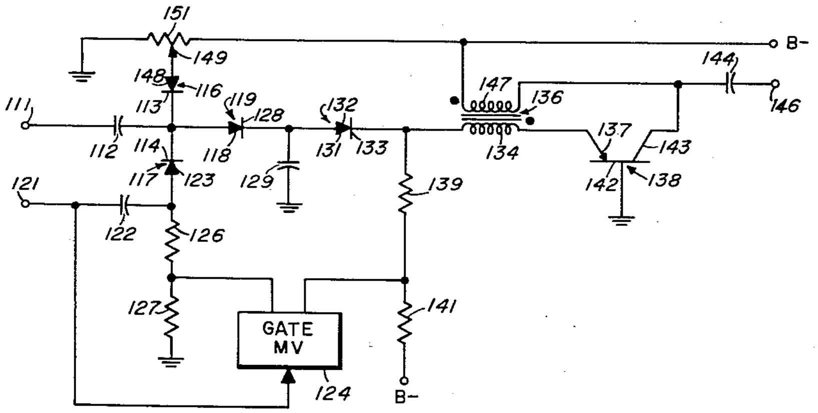
FIG. 2 is a schematic diagram of the preferred embodiment of the present invention.

Referring now to FIG. 2 in detail, input terminal 111 is connected thru capacitor 112 to cathodes 113 and 114 of diodes 116 and 117 respectively, and to anode 118 of diode 119. Terminal 121 is connected thru capacitor 122 to anode 123 of diode 117 and also to gate multivibrator 124. The junction of capacitor 122 and anode 123 is connected thru resistors 126 and 127 to ground. The junction of resistors 126 and 127 is connected to one output of gate multivibrator 124. Cathode 128 of diode 119 is connected thru capacitor 129 to ground and to anode 131 of diode 132. Cathode 133 of diode 132 is connected thru winding 134 of transformer 136 to emitter 137 of transistor 138, and thru resistors 139 and 141 in series to B minus. The junction of resistors 139 and 141 is connected to a second output of gate multi-vibrator 124. Base 142 of transistor 138 is grounded. Collector 143 of transistor 138 is connected thru capacitor 144 to output terminal 146, and thru winding 147 of transformer 136 to B minus. Anode 148 of diode 116 is connected to sliding contact 149 of resistor 151. Resistor 151 is connected between ground and B minus.

*Operation*

Figure 3:
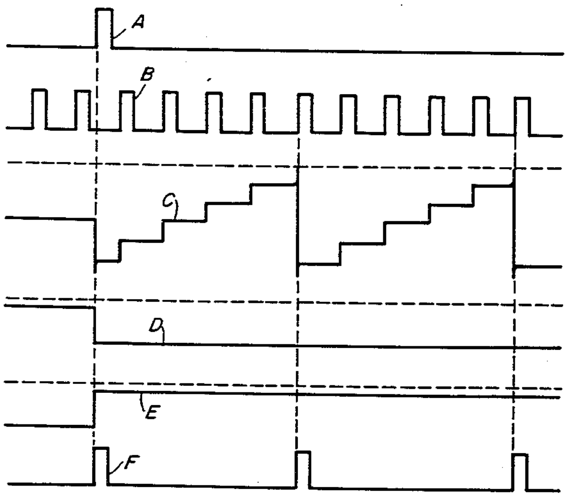
FIG. 3 illustrates the waveforms present throughout the various points of FIGS. 1 and 2.

Referring again to FIG. 1 in conjunction with the waveforms of FIG. 3, the operation of the prior art vacuum tube energy storage counter will be discussed. At zero time, reset trigger A is applied to terminal 36 which fires blocking oscillator 26 by pulsing cathode 31 thru diode 33. A pulse of voltage will appear on plate 28 which is coupled from windings 29 of transformer 23 to winding 22 of transformer 23 and appear on grid 24 as a positive pulse. This positive grid voltage will then cause grid current to flow, discharging capacitor 27, until a negative charge is accumulated equal to the voltage picked off on resistor 20 and coupled thru rectifiers 17 and 14. When this occurs, diodes 17 and 14 conduct and capacitor 19 holds the charge on capacitor 27 at this conduction level. After the blocking oscillator action is completed, diodes 17 and 14 cut off, and capacitor 27 is prevented from charging by the high impedance of the grid circuit of triode 26 and the cut off impedance of diode 14. A negative voltage well below the cut off level of tube 26 will now be present on grid 24 of tube 26. This is shown by waveform C at zero time. When a positive input pulse is applied at terminal 11, shown as waveform B in FIG. 2, capacitor 12 will charge and capacitor 27 will discharge thru diode 14. The amount of discharge occurring in capacitor 27 will depend upon the duration and amplitude of the pulse at terminal 11 and the relative capacitance of capacitors 12 and 27. After the first pulse is applied at input terminal 11 point G will then be at the first step of waveform C. Each succeeding pulse will cause successive discharges of capacitor 27 and charging of capacitor 12 until capacitor 27 has discharged to the cut off potential of triode 26. This will occur on the fifth step of waveform C. At this time the blocking oscillator will fire again discharging capacitor 27 and leaving the system ready for an additional count.

Referring now to FIG. 2 the basic operating principal of this circuit is identical with that of the vacuum tube version shown in FIG. 1, with rectifier 116 equivalent to rectifier 17 and rectifier 119 equivalent to rectifier 14. In order to maintain the cut off impedance as required with this type of circuit, silicon diodes are employed. An additional diode 132 has been added in order to isolate the low impedance of the transistor from the energy storage capacitor and prevent the charge accumulated on capacitor 129 from leaking off between input pulses. It was found however that diode 132 caused the transistor emitter to float at an unpredictable voltage level which effected both the condition of diode 132 and the firing potential of transistor 138. To overcome this difficulty a double gating system had to be employed, which in this embodiment consists of a multivibrator 124 which is triggered by reset trigger A applied at terminal 121. The operation will now be described in detail.

During the off time of the counting system a gate voltage of approximately ground potential, shown as waveform D, is applied to the junction of resistors 126 and 127 from one output of multivibrator 124, and a gate voltage of a fixed negative potential shown as waveform E is applied at the junction of resistors 139 and 141 from the other output of gate multivibrator 124. This cuts off diode 116 and causes diodes 117, 119, and 132 to conduct. Capacitor 129 will then charge to some negative potential which is set by the outputs of gate multivibrator 124 and resistors 126, 127, 139 and 141 to be just below the firing potential of transistor 138. At zero time, reset trigger A is applied to terminal 121 and thru capacitor 122. The charging of capacitor 122 will raise the D.C. potential at the top of resistor 139 and emitter 137 of transistor 138 to the firing point of transistor 138. At the same time reset trigger A is applied to gate multivibrator 124, which is a bistable multivibrator, changing the outputs as shown by waveforms D and E. Thus, the junction of resistors 126 and 127 is driven negative, and the junction of resistors 139 and 141 is driven positive. This will cut off diode 117 and raise voltage on emitter 137 of transistor 138 to the firing potential. Single swing blocking oscillator action takes place in transistor 138 due to positive feedback supplied by transformer 136. The sudden surge of current thru transistor 138 will drive the top of resistor 139 negative and charge capacitor 129 in a negative direction. Capacitor 129 will continue charging until the potential of wiper 149 on resistor 151 is reached, at which time diodes 116 and 119 clamp capacitor 129 to this level. Each of the input pulses B applied to input terminal 111 will cause capacitor 129 to discharge an incremental amount determined by the amplitude and duration of the pulse, and the relative size of capacitors 112 and 129. When the bias applied by gate multivibrator 124 to emitter 137 of transistor 138 has been overcome, blocking oscillator action results which resets the charge on capacitors 129 and 112, leaving the system ready for the next counting cycle.

In order to maintain stability of count, the amplitude of the final or firing step on capacitor 129 (in this illustration the fifth step) must be greater than the changes in firing potential of the transistor which occur over the required range of operating temperature. This requires a large amplitude of feedback voltage. Since the magnitude of the steps appearing on capacitor 129 decreases exponentially as the charge approaches the amplitude of the input pulse, the amplitude of the input pulse should be much higher than the feedback pulse in order to maintain a relatively constant step amplitude on capacitor 129. Also, as counter circuits are sometimes operated in series, the output pulse should be greater than the feedback pulse for maximum stability. In the preferred embodiment this is assured by utilizing a 2:1 step down turns ratio between the collector winding 147 and emitter winding 134 of feedback transformer 136.

While a PNP type transistor has been shown in conjunction with a negative power supply, obviously an NPN type transistor with a corresponding change in power supply polarity and reversal of diode polarities could be employed in the light of the above teachings. It is therefore to be understood that within the scope of the appended claims, the invention may be practiced otherwise than as specifically described.

What is claimed is:

1. A transistor energy storage counter comprising a semiconductor having at least emitter, base and collector elements, said base element being connected to a common reference potential, trigger responsive control means for applying a predetermined potential across said emitter and collector electrodes to maintain the proper initial count following a zero time condition, positive feedback means connected between said collector and emitter electrodes, unidirectional coupling means having anode and cathode elements coupling input pulses to said emitter electrode, a first coupling capacitor coupling input pulses to said unidirectional coupling means, a second capacitor and means connecting said second capacitor between said emitter and said common reference potential.

2. The transistor energy storage counter of claim 1 wherein said last mentioned means comprises second unidirectional coupling means interposed between one side of said capacitor and said emitter, said first mentioned unidirectional coupling means and said second unidirectional coupling means being in serial relationship with said emitter electrode.

3. The transistor energy storage counter of claim 2 wherein said control means comprises a trigger coupled to said first mentioned unidirectional coupling means and gating means responsive to said trigger, said gating means having first and second outputs, said first and second outputs having voltages reversing with each trigger applied to the input thereof, said first output coupled to said emitter electrode, and said second output coupled to the anode side of said first unidirectional coupling means.

4. The transistor energy storage counter of claim 3 wherein a third unidirectional coupling means is interposed between said second output and said first mentioned unidirectional coupling means.

5. The transistor energy storage counter of claim 4 including a fourth unidirectional coupling means connected between the junction of said first mentioned and said third unidirectional coupling means and a predetermined potential.

6. The transistor energy storage counter of claim 1 wherein said feedback means comprises a transformer.

7. The transistor energy storage counter of claim 6 wherein said transformer comprises a first winding connected in series with said collector and a second winding connected in series with said emitter, said first winding having a larger number of turns than said second winding.

References Cited in the file of this patent

UNITED STATES PATENTS

| | | |
|---|---|---|
| 2,829,280 | Goodall | Apr. 1, 1958 |
| 2,873,388 | Trumbo | Feb. 10, 1959 |
| 2,889,510 | Carmichael | June 2, 1959 |
| 2,906,893 | Mattson | Sept. 29, 1959 |